United States Patent
Haraguchi (10) Patent No.: US 8,674,720 B2
(45) Date of Patent: Mar. 18, 2014

(54) SEMICONDUCTOR DEVICE AND METHOD OF ADJUSTING AN IMPEDANCE OF AN OUTPUT BUFFER

(76) Inventor: Yoshinori Haraguchi, Tokyo (JP)

(*) Notice: Subject to any disclaimer, the term of this patent is extended or adjusted under 35 U.S.C. 154(b) by 0 days.

(21) Appl. No.: 13/545,701

(22) Filed: Jul. 10, 2012

(65) Prior Publication Data
US 2013/0015880 A1    Jan. 17, 2013

(30) Foreign Application Priority Data
Jul. 12, 2011  (JP) ................. 2011-153666

(51) Int. Cl.
*H03K 19/00*    (2006.01)
*G11C 7/02*    (2006.01)

(52) U.S. Cl.
USPC .......... 326/30; 326/21; 326/86; 365/206

(58) Field of Classification Search
USPC .............. 326/21–34, 59, 60, 80–92
See application file for complete search history.

(56) References Cited

U.S. PATENT DOCUMENTS

| | | | | |
|---|---|---|---|---|
| 5,319,600 | A * | 6/1994 | Harada | 365/206 |
| 5,627,792 | A * | 5/1997 | Tsujimoto | 365/230.03 |
| 6,947,336 | B2 * | 9/2005 | Kim et al. | 365/189.05 |
| 7,038,486 | B2 * | 5/2006 | Aoyama et al. | 326/30 |
| 7,323,901 | B2 * | 1/2008 | Aoyama et al. | 326/30 |
| 7,638,871 | B2 * | 12/2009 | Noda et al. | 257/691 |

FOREIGN PATENT DOCUMENTS

JP    2005-150392 A    6/2005

\* cited by examiner

*Primary Examiner* — Douglas W Owens
*Assistant Examiner* — Nelson Correa
(74) *Attorney, Agent, or Firm* — Sughrue Mion, PLLC (57) ABSTRACT

A semiconductor device has a ZQ circuit (40) which generates impedance control information and an output buffer having an impedance controlled in response to the impedance control information. A plurality of control bits constituting the impedance control information are serially transferred from the ZQ circuit.

14 Claims, 8 Drawing Sheets

SEMICONDUCTOR DEVICE AND METHOD OF ADJUSTING AN IMPEDANCE OF AN OUTPUT BUFFER

This application is based upon and claims the benefit of priority from Japanese patent application No. 2011-153666, filed on Jul. 12, 2011, the disclosure of which is incorporated herein in its entirety by reference.

TECHNICAL FIELD

This invention relates to a semiconductor device including an impedance control circuit and to a method of adjusting an impedance of an output buffer.

BACKGROUND ART

In recent years, data transfer between semiconductor devices (e.g. between a CPU and a memory) requires a higher data transfer rate. For the purpose of further increasing the data transfer rate, the amplitudes of input and output signals have been reduced more and more. When the amplitudes of input and output signals are reduced, the accuracy required for the impedance of an output buffer becomes stricter in order to output a signal with an exact amplitude.

The impedance of the output buffer not only varies depending on the process condition in the manufacture, but changes also in actual use of a semiconductor device due to the influence of a variation in ambient temperature or a fluctuation in power supply voltage. Therefore, when high impedance accuracy is required for the output buffer, the output buffer should have an impedance adjustment function. Such impedance adjustment of the output buffer is carried out using a circuit, generally called an impedance control circuit, which is provided in the semiconductor device.

The impedance control circuit includes a replica buffer having the same structure as the output buffer. The impedance adjustment of the output buffer is carried out in the following manner. An external resistance is connected between an impedance adjustment external terminal (ZQ terminal) of the semiconductor device and, for example, a board on which the semiconductor device is mounted. A voltage appearing at the ZQ terminal is compared with a reference voltage. According to a comparison result, the impedance of the replica buffer is adjusted. Then, the content of adjustment (specified by impedance control information) of the replica buffer is reflected on the output buffer. Thus, the impedance of the output buffer is adjusted to a desired value.

For example, Patent Document 1 (JP-A-2005-150392) discloses one example of a semiconductor device including an impedance control circuit which is adapted to adjust the impedance of an output buffer.

SUMMARY OF THE INVENTION

However, the impedance control circuit disclosed in Patent Document 1 outputs, in parallel, a plurality of bits of impedance control information for use in adjusting the impedance of the output buffer and therefore requires a plurality of wires corresponding in number to the bits. This results in an increase in wiring area and an increase in chip size. Particularly, in an edge pad structure which has data terminals DQ for outputting data from an output buffer and ZQ terminals both of which are arranged on opposite sides, respectively, a plurality of wires extend between the opposite sides. In this case, there arises a problem that the wiring area at a central portion of the chip is enlarged and, as a result, brings about an increase in chip size.

This invention seeks to solve one or more of the above-mentioned problems or to improve upon those problems at least in part.

According to one embodiment of this invention, there is provided a semiconductor device comprising a ZQ circuit which generates impedance control information including a plurality of control bits and an output buffer having an impedance controlled in response to the impedance control information, wherein the control bits constituting the impedance control information are serially transferred from the ZQ circuit.

According to another embodiment of this invention, there is provided a semiconductor chip having a first region, a second region, and a third region interposed between the first and the second regions, the semiconductor chip comprising a ZQ terminal arranged in the first region, a ZQ circuit which is arranged in the first region and connected to the ZQ terminal and which generates impedance control information constituted by a plurality of control bits, a DQ terminal arranged in the second region, an output buffer which is arranged in the second region and connected to the DQ terminal and which has an impedance adjusted in response to the impedance control information, and a serial bus which is extracted from the ZQ circuit and reaches the second region across the third region and which serially transfers the control bits from the ZQ circuit.

According to a further embodiment of this invention, there is provided a method of adjusting an impedance of an output buffer, comprising generating a plurality of control bits in parallel in response to a ZQ command, serially transferring the control bits generated in parallel, converting the serially transferred control bits into parallel data, and adjusting the impedance of the output buffer in response to the control bits converted into the parallel data.

BRIEF DESCRIPTION OF THE DRAWINGS

The above features and advantages of this invention will be more apparent from the following description of certain preferred embodiments taken in conjunction with the accompanying drawings, in which.

MODE FOR CARRYING OUT THE INVENTION

Referring to the accompanying drawings, a preferred embodiment of this invention will be described in detail hereinbelow.

Figure 1:
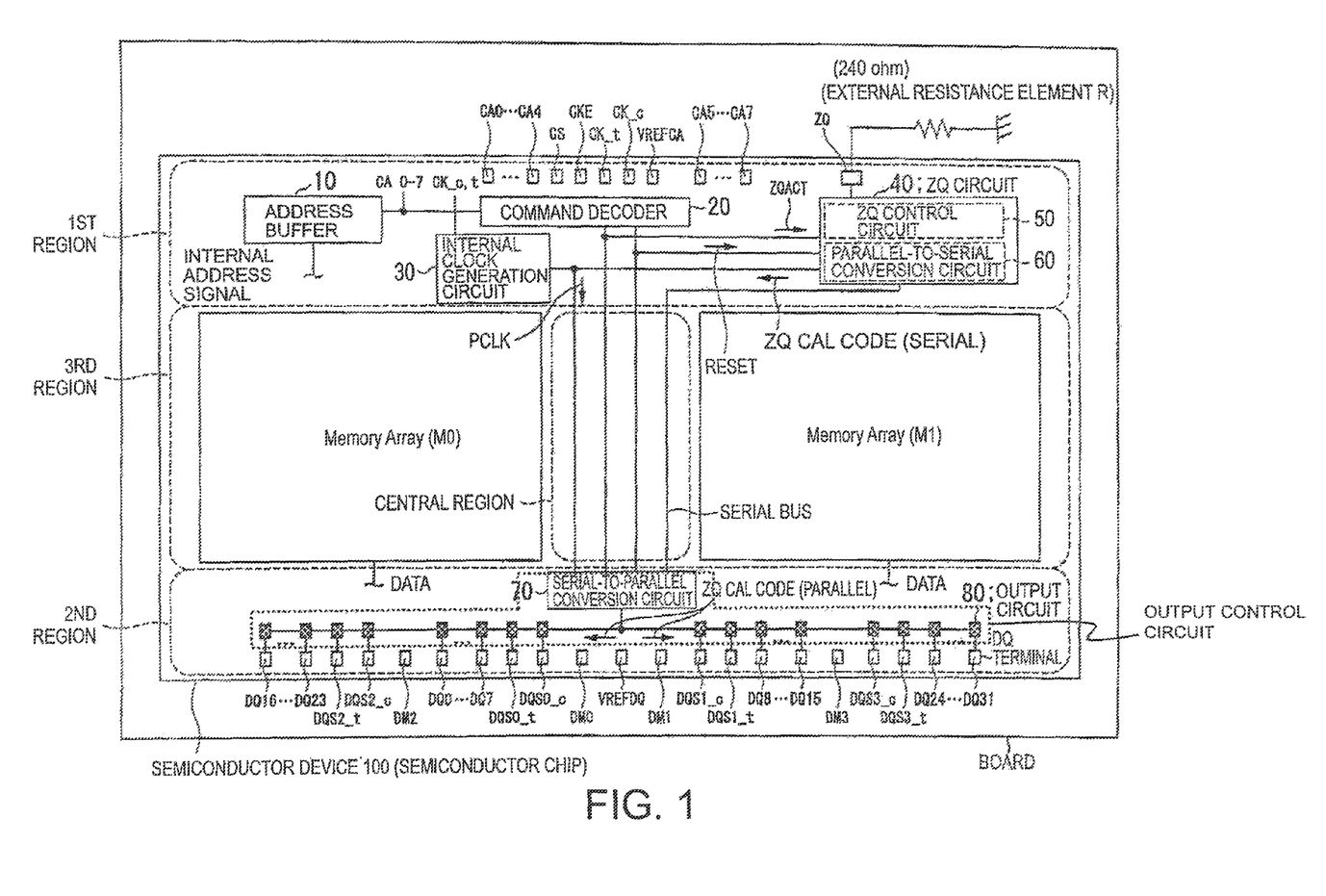
FIG. 1 is a block diagram showing the structure of a semiconductor device according to a first embodiment of this invention.

FIG. 1 shows a schematic structure of a semiconductor device 100 according to a first embodiment of this invention. Herein, the illustrated semiconductor device 100 is an example of an SDRAM (synchronous dynamic random access memory) which operates synchronously with a clock signal supplied from the outside. Although the structure of the DRAM is used in this embodiment, this invention is not limited thereto and may be applied to a semiconductor memory (SRAM (Static RAM), PRAM (Phase Change RAM), flash memory, or the like) other than the DRAM or may be applied to a controller other than the memory.

As shown in FIG. 1, the semiconductor device 100 (semiconductor chip) has a first region, a second region, and a third region and circuit blocks are respectively formed in these regions. The circuit blocks shown in FIG. 1 are formed on the same semiconductor chip made of single-crystal silicon. Each circuit block is formed by a plurality of transistors such as PMOS transistors (p-channel MOS transistors) and NMOS transistors (n-channel MOS transistors) The semiconductor device 100 is mounted on a board.

In FIG. 1, marks □ (small white square marks) respectively denote pads as external terminals provided on the semiconductor chip. The semiconductor device 100 (semiconductor chip) has an edge pad structure. Specifically, in the second region, data terminals (DQ0 to DQ31), data strobe terminals (DQS0_c to DQS3_c, DQS0_t to DQS3_t), data mask terminals (DM0 to DM3), and a VREFDQ terminal are arranged. In the first region, clock terminals (CK_c, CK_t), a clock enable terminal (CKE), a chip select terminal (CS), command address terminals (CA0 to CA7), a VREFCA terminal, and a ZQ terminal are arranged.

The ZQ terminal is connected to a ground power supply VSS through an external resistance element R. The external resistance element R is provided not on the semiconductor device 100 but on the board. In this embodiment, the external resistance element R has a resistance value of 240 ohm. However, this invention is not limited thereto and the resistance value may be appropriately determined according to a specification.

In the semiconductor device 100, the first region includes an address buffer 10, a command decoder 20, an internal clock generation circuit 30, and a ZQ circuit 40. The second region includes a serial-to-parallel conversion circuit 70 and a plurality of output circuits 80 corresponding to the data terminals (DQ0 to DQ31) and the data strobe terminals (DQS0_c to DQS3_c, DQS0_t to DQS3_t), respectively.

The third region includes a memory array M0, a memory array M1, and a central region.

The address buffer 10 captures, at a fall timing (trailing edge) of the clock signal, an external address signal supplied from the command address terminals CA0 to CA7, produces an internal address signal in response to the external address signal, and outputs the internal address signal to the memory arrays M0 and M1. Each of the memory arrays M0 and M1 is provided with a plurality of banks (e.g. four banks in each of the memory arrays M0 and M1) although not shown in the figure. Each bank is selected in response to a bank address. Each bank includes a plurality of word lines, a plurality of bit lines, a plurality of memory cells, a plurality of sense amplifies, and so on.

The command decoder 20 captures, at a rise timing (leading edge) of the clock signal, the external command signal supplied from the command address terminals CA0 to CA7, produces a plurality of internal command signals in response to the external command signal, and outputs the internal command signals to the respective internal circuits. In this embodiment, the command address terminals CA0 to CA7 are commonly used for receiving the external command signal and the external address signal and, in addition, both the external command signal and the external address signal are supplied in response to a leading edge and a trailing edge of the clock signal, respectively. However, this invention is not limited to the above-mentioned structure.

In the case where the external command signal supplied from the command address terminals CA0 to CA7 requests an operation (read operation) of outputting data stored in memory cells of the memory arrays M0 and M1, the command decoder 20 outputs a read command signal to the memory arrays M0 and M1. In response to the read command signal, the memory arrays M0 and M1 output a data control signal 1 and a data control signal 2 (FIG. 2) to the output circuits 80 (details will be described later).

In the case where the external command signal supplied from the command address terminals CA0 to CA7 requests execution of a ZQ calibration operation (On Die Termination operation mode), the command decoder 20 renders internal command signals ZQACT (control signals ZQACT1, ZQACT2) into an active level. Further, the command decoder 20 changes a reset signal RESET into an active level when the semiconductor device 100 is turned on.

In the case where the external command signal supplied from the command address terminals CA0 to CA7 requests execution of the read operation or the ZQ calibration operation, the command decoder 20 outputs an active-level (high-level) internal command to the output circuits 80, thereby carrying out data output control of output buffers 82 in the output circuits 80 or controlling the output buffers 82 so that, for example, the output circuits 80 function as terminal resistances (details will be described later).

The internal clock generation circuit 30 produces an internal clock signal PCLK in response to external clock signals from the CK_c and CK_t terminals.

The ZQ circuit 40 is connected to the ZQ terminal and includes a ZQ control circuit 50 and a parallel-to-serial conversion circuit 60. In response to the internal command signals ZQACT and the reset signal RESET sent from the command decoder 20 and the internal clock signal PCLK sent from the internal clock generation circuit 30, the ZQ circuit 40 serially outputs a control signal ZQ CAL Code which adjusts the impedance of each of the output buffers 82. The serial control signal ZQ CAL Code produced by the ZQ circuit 40 is supplied to the serial-to-parallel conversion circuit 70 through a serial bus provided in the central region of the third region. Thus, by providing the serial bus in the central region of the third region and further by providing the serial-to-parallel conversion circuit 70 in a central portion of the second region (in alignment with the central region of the third region), a control signal ZQ CAL Code (parallel) outputted from the serial-to-parallel conversion circuit 70 reaches the output circuits 80 at more equal timings.

According to this embodiment, a plurality of control bits for controlling the impedance of the output buffer 82 are serially transferred from the ZQ circuit 40 so as to reduce the number of wires required for transferring the plurality of control bits. This make it possible to diminish the wiring area and thus to reduce the chip size.

In recent years, with the miniaturization of semiconductor devices, semiconductor chips are required to be reduced in size. Since the circuit density of memory array regions is greater than that of the other regions, it is desirable that the area of the central region be reduced in the third region. In this invention, the ZQ circuit 40 serially outputs the control signal ZQ CAL Code so as to reduce the number of signal wires required for transferring the control signal and thus to reduce the wiring area correspondingly. Particularly in the semiconductor device of the edge pad structure as in this embodiment, the wiring area can be reduced more effectively. Details of the ZQ circuit 40 will be described later.

The data terminals (DQ0 to DQ31) and the data strobe terminals (DQS0_c to DQS3_c, DQS0_t to DQS3_t) are connected to the output circuits 80, respectively. The impedance of the output buffer 82 (see FIG. 2) provided in each output circuit 80 is adjusted by the control signal ZQ CAL Code (parallel) which is outputted, in parallel, from the serial-to-parallel conversion circuit 70.

Figure 2:
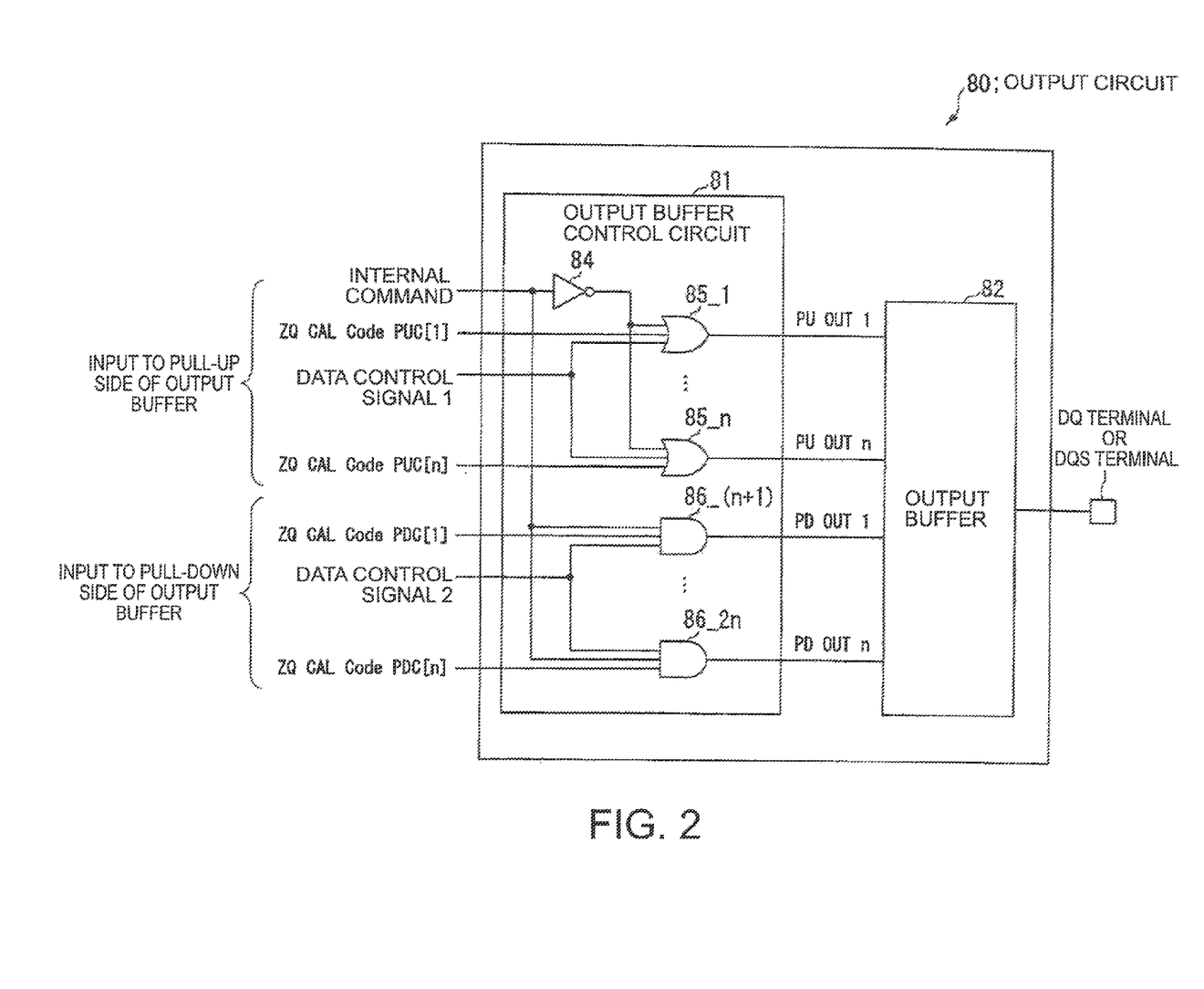
FIG. 2 is a block diagram showing the structure of an output circuit 80.

FIG. 2 is a diagram showing a block structure of each of the output circuits 80 connected to the data terminals (DQ0 to DQ31) and the data strobe terminals (DQS0_c to DQS3_c, DQS0_t to DQS3_t), as illustrated in FIG. 1.

As shown in FIG. 2, the output circuit 80 includes an output buffer control circuit 81 and the output buffer 82.

The output buffer control circuit 81 includes an inverter circuit 84, OR circuits 85_1 to 85_n, and AND circuits 86_(n+1) to 86_2n.

Supplied with the internal command from the command decoder 20 (FIG. 1), the inverter circuit 84 inverts the level of the internal command to produce an inverted internal command as an output signal, and sends the output signal to the OR circuits 85_1 to 85_n.

Each of the OR circuits 85_1 to 85_n is supplied with the output signal of the inverter circuit 84, a control signal ZQ CAL Code (PUC[i] (1≤i≤n)), and the data control signal 1. When at least one of the three signals supplied thereto has a high level, the OR circuit outputs high-level PU OUT i to the output buffer 82 (will later be described in detail).

Each of the AND circuits 86_(n+1) to 86_2n is supplied with the internal command, a control signal ZQ CAL Code (PDC[i] (1≤i≤n)), and the data control signal 2. When all of the three signals supplied thereto has a high level, the AND circuit outputs high-level PD OUT i to the output buffer 82.

Herein, the data control signals 1 and 2 are produced by the internal command and the data read from the memory cell arrays during the read operation. The control signals ZQ CAL Code (PUC[i] (1≤i≤n)) and ZQ CAL Code (PDC[i] (1≤i≤n)) constitute the control signal ZQ CAL Code (parallel) illustrated in FIG. 1.

Specifically, the output buffer control circuit 81 is activated when the internal command is put into a high level during the ZQ calibration or the read operation.

When the output buffer 82 produces high data (H data) during the read operation, both of the data control signals 1 and 2 have a low level and the output buffer control circuit 81 changes all of PD OUT1 to PD OUTn into a low level. As a consequence, NMOS transistors constituting the output buffer 82 are turned off (non-conduction state).

In response to the control signals ZQ CAL Code (PUC[1] to PUC[n]), the output buffer control circuit 81 changes PU OUT1 to PU OUTn into a low level or a high level. Consequently, PMOS transistors constituting the output buffer 82 and supplied with low-level ones of PU OUT1 to PU OUTn are turned on (conduction state) because each gate level is placed at a low level. On the other hand, PMOS transistors constituting the output buffer 82 and supplied with high-level ones of PU OUT1 to PU OUTn are turned off because a gate level is at a high level.

On the other hand, when the output buffer 82 produces low data (L data) during the read operation, both of the data control signals 1 and 2 have a high level and the output buffer control circuit 81 changes all of PU OUT1 to PU OUTn into a high level. Consequently, all of the PMOS transistors constituting the output buffer 82 are turned off.

In response to the control signals ZQ CAL Code (PDC[1] to PDC[n]), the output buffer control circuit 81 changes PD OUT1 to PD OUTn into a low level or a high level. Consequently, NMOS transistors constituting the output buffer 82 and supplied with low-level ones of PD OUT1 to PD OUTn are turned off (non-conduction state) because a gate level is at a low level. On the other hand, NMOS transistors constituting the output buffer 82 and supplied with high-level ones of PD OUT1 to PD OUTn are turned off because a gate level is at a high level.

Thus, during the read operation, the output circuit 80 adjusts the control signals ZQ CAL Code (PUC[1] to PUC[n], PDC[1] to PDC[n]) by the ZQ calibration (namely, ZQ calibration codes, namely, impedance codes) so that the output buffer 82 outputs the data stored in the memory cells to the outside at a desired impedance (240 ohm in this embodiment). At any rate, the output circuit 80 serves to adjust the control signal ZQ CAL Code (PUC[1] to PUC[n], PDC[1] to PDC[n]) in cooperation with the serial-to-parallel conversion circuit 70. Therefore, the serial-to-parallel conversion circuit 70 and the output circuit 80 may be collectively called an output control circuit.

During the ZQ calibration, the data control signals 1 and 2 are put into a low level and a high level, respectively, and the output buffer control circuit 81 changes PD OUT1 to PD OUTn and PU OUT1 to PU OUTn into a low level or a high level in response to the control signal ZQ CAL Code (parallel).

As a consequence, the PMOS transistors constituting the output buffer 82 and supplied with low-level ones of PU OUT1 to PU OUTn are turned on (conduction state) because a gate level is a low level. The PMOS transistors constituting the output buffer 82 and supplied with high-level ones of PU OUT1 to PU OUTn are turned off because a gate level is a high level. On the other hand, the NMOS transistors constituting the output buffer 82 and supplied with low-level ones of PD OUT1 to PD OUTn are turned off because a gate level is a low level. The NMOS transistors constituting the output buffer 82 and supplied with high-level ones of PD OUT1 to PD OUTn are turned on because a gate level is a high level.

Figure 3:
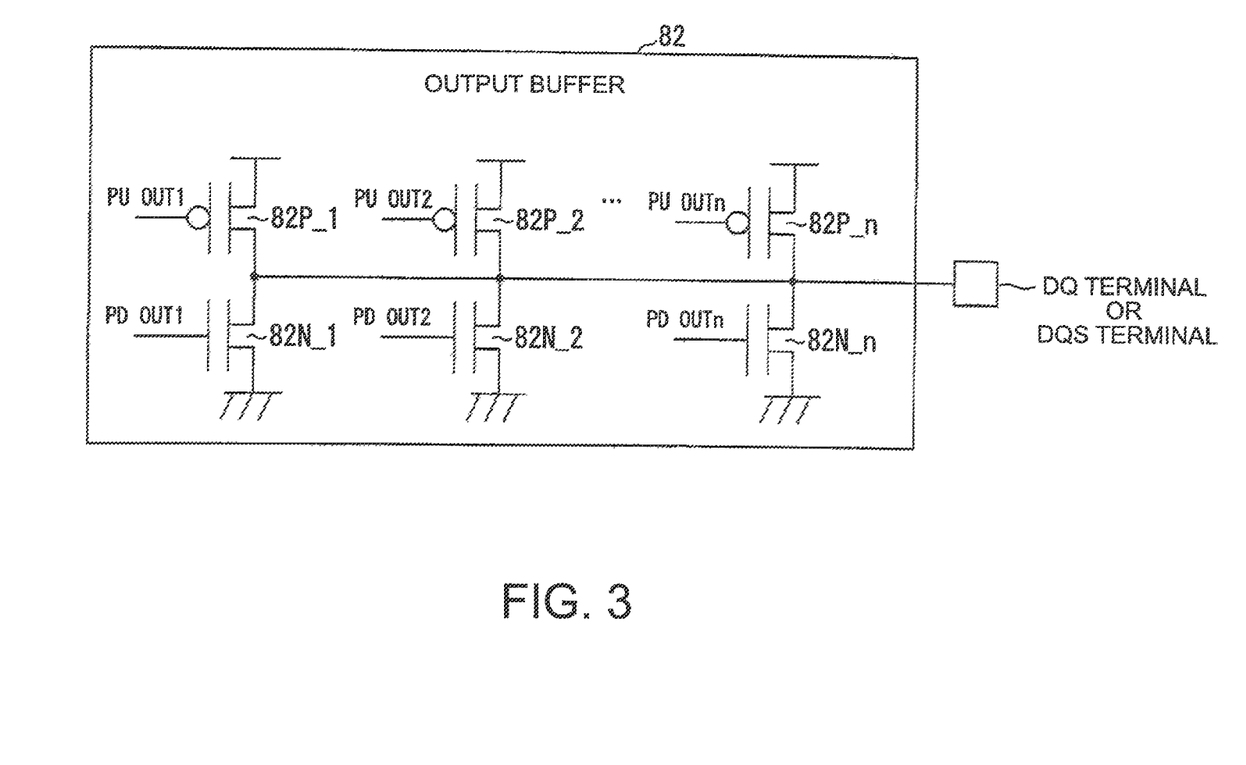
FIG. 3 is a circuit diagram of an output buffer 82.

Thus, during the ZQ calibration, an output voltage appearing at each of the data terminals (DQ0 to DQ31) and the data strobe terminals (DQS0_c to DQS3_c, DQS0_t to DQS3_t) is equal to a voltage which is obtained by dividing a difference voltage between a power supply voltage and a ground voltage of the output buffer 82 by those impedances of each PMOS transistor and each NMOS transistor which are being adjusted in the output buffer 82, as will be readily understood from FIG. 3. If the impedances are determined or fixed by the ZQ calibration, the output voltage becomes equal to an intermediate voltage (VDD/2) between the power supply voltage and the ground voltage. By measuring the output voltage, for example, using a tester, it is possible to know whether or not impedance adjustment has accurately been carried out. Alternatively, use may be made of a structure in which an impedance code is not changed after completion of the impedance adjustment by the ZQ calibration. In this case, by supplying another command to the command decoder 20, the data control signals 1 and 2 are set at a low level and a high level, respectively, like in the ZQ calibration so that the output buffer 82 functions as a terminal resistance at a desired impedance (240 ohm in this embodiment).

FIG. 3 is a circuit diagram of the output buffer 82 in the output circuit 80. As illustrated in FIG. 3, the output buffer 82 comprises the PMOS transistors 82P_1 to 82P_n arranged between a power supply and the data terminals (DQ0 to DQ31) or the data strobe terminals (DQS0_c to DQS3_c, DQS0_*t* to DQS3_*t*), and the NMOS transistors 82N_1 to 82N_n arranged between the data terminals (DQ0 to DQ31) or the data strobe terminals (DQS0_*c* to DQS3_*c*, DQS0_*t* to DQS0_*t*) and the ground.

PU OUT1 to PU OUTn as outputs of the output buffer control circuit 81 are supplied to gate electrodes of the PMOS transistors, respectively, and PD OUT1 to PD OUTn are supplied to gate electrodes of the NMOS transistors, respectively.

As described above, during the ZQ calibration, the gate electrodes of the respective transistors are supplied with the control signals PU OUT1 to PU OUTn and PD OUT1 to PD OUTn outputted from the output buffer control circuit 81 in response to ZQ CAL Code (PUC[1] to PUC[n]). Thus, depending on ON/OFF conditions of the transistors, the impedance of the output buffer 82 is determined.

Figure 4:
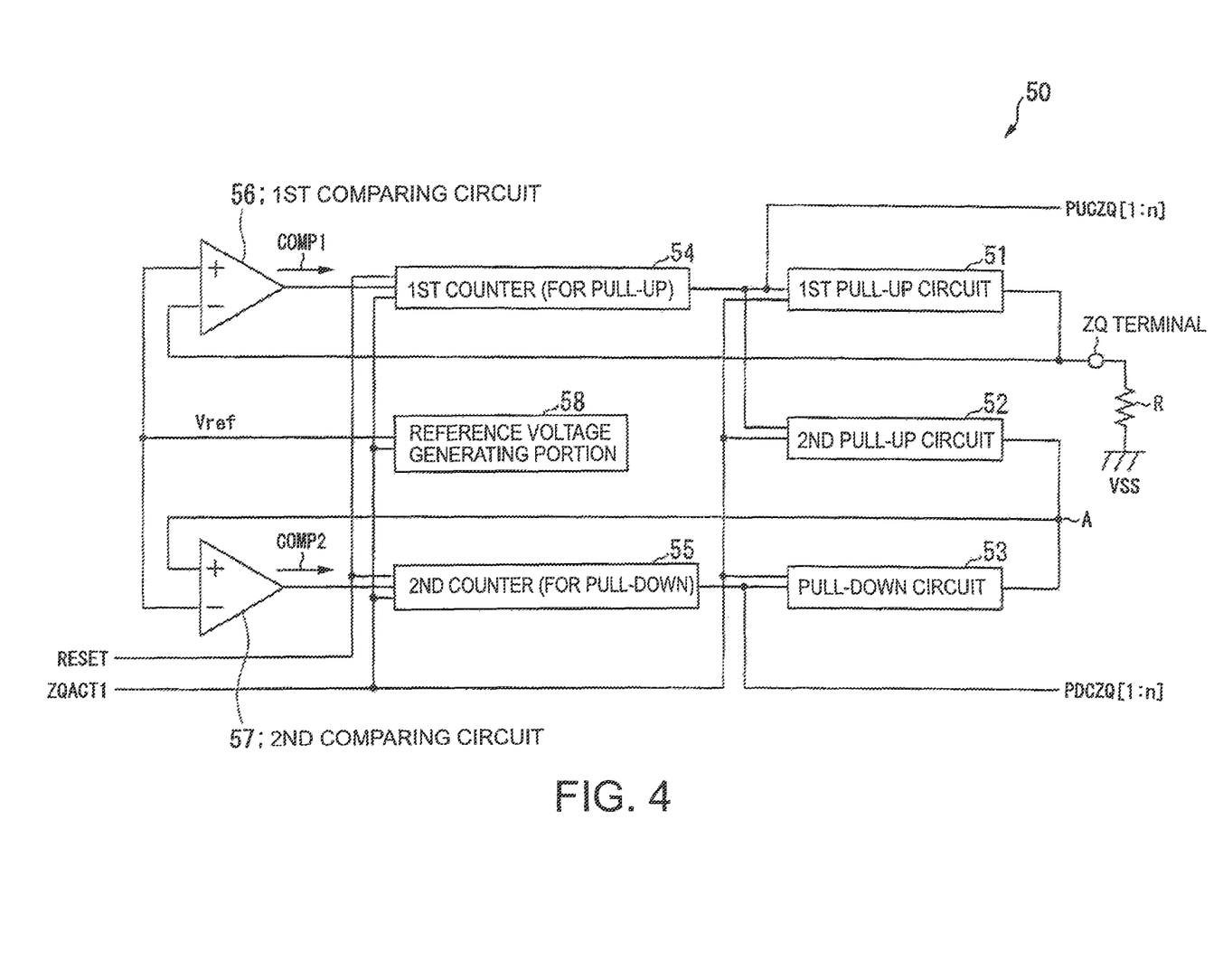
FIG. 4 is a block diagram showing the structure of a ZQ control circuit 50.

FIG. 4 is a circuit diagram of the ZQ control circuit 50. The ZQ control circuit 50 comprises a first pull-up circuit 51, a second pull-up circuit 52, a pull-down circuit 53, a first counter 54 for controlling operations of the first and the second pull-up circuits 51 and 52, a second counter 55 for controlling operation of the pull-down circuit 53, a first comparing circuit 56 for controlling the first counter 54, a second comparing circuit 57 for controlling the second counter 55, and a reference voltage generating portion 58.

The ZQ control circuit 50 operates in response to the control signal ZQACT1 outputted from the command decoder 20 and outputs, in parallel, impedance control information including a plurality of control bits PUCZQ[1:n] and PDCZQ[1:n] for adjusting the impedances of the output circuits 80. Now, description will be made in detail.

The first pull-up circuit 51 has a circuit structure same as that of a pull-up circuit (PMOS transistors 82P_1 to 82P_n) of the output buffer 82. Specifically, the first pull-up, circuit 51 comprises PMOS transistors, n in number, connected in parallel to one another and having drains connected in common to the ZQ terminal.

The PMOS transistors, n in number, connected in parallel have gates supplied with the control bits PUCZQ[1:n] (constituting the impedance control information) from the first counter 54. The operation of the first pull-up circuit 51 is controlled by these control bits.

The second pull-up circuit 52 has the same circuit structure as that of the first pull-up circuit 51. The second pull-up circuit 52 comprises PMOS transistors, n in number, having gates supplied with the control bits PUCZQ[1:n] from the first counter 54, like the first pull-up circuit 51.

The pull-down circuit 53 has the same circuit structure as that of a pull-down circuit (NMOS transistors 82N_1 to 82N_n) of the output buffer 82. Specifically, the pull-down circuit 53 comprises NMOS transistors, n in number, connected in parallel to one another. The NMOS transistors have gates supplied with the control bits PDCZQ[1:n] (constituting the impedance control information) from the second counter 55. Operation of the pull-down circuit 53 is controlled by these control bits.

The second pull-up circuit 52 and the pull-down circuit 53 constitute a "replica buffer." Therefore, the replica buffer has the same circuit structure as that of the output buffer 82.

A point A of connection operable as an output end of the replica buffer is connected to a non-inverting input terminal (+) of the second comparing circuit 57.

The first counter 54 (for pull-up) acts as a counter for carrying out a counting operation, i.e., a count-up or a count-down operation, when the control signal ZQACT1 is activated. While a comparison signal COMP1, namely, an output of the first comparing circuit 56 has a high level, the first counter 54 continues the count-up operation. While the comparison signal COMP1 has a low level, the first counter 54 continues the count-down operation. The first comparing circuit 56 has an inverting input terminal (−) connected to the ZQ terminal and a non-inverting input terminal (+) connected to an output of the reference voltage generating portion 58.

With the above-mentioned structure, the first comparing circuit 56 compares a potential of the ZQ terminal with, for example, an intermediate potential (VDD/2). If the former potential is higher, the first comparing circuit 56 produces the comparison signal COMP1 of a high level. If the latter potential is higher, the first comparing circuit 56 produces the comparison signal COMP1 of a low level.

On the other hand, the second counter (for pull-down) 55 acts as a counter for carrying out a counting operation, i.e., a count-up or a count-down operation after the control signal ZQACT1 is activated and impedance adjustment of the first and the second pull-up circuits 51 and 52 is executed. When a comparison signal COMP2, namely, an output of the second comparing circuit 57 has a high level, the second counter 55 continues the count-up operation. While the comparison signal COMP2 has a low level, the second counter 55 continues the count-down operation. The second comparing circuit 57 has the non-inverting input terminal (+) connected to the point A of connection, namely, the output end of the replica buffer and an inverting input terminal (−) connected to the output of the reference voltage generating portion 58.

With the above-mentioned structure, the second comparing circuit 57 compares an output potential of the replica buffer with, for example, the intermediate potential (VDD/2). If the former potential is higher, the second comparing circuit 57 produces the comparison signal COMP2 of a high level. If the latter potential is higher, the second comparing circuit 57 produces the comparison signal COMP2 of a low level.

When the control signal ZQACT1 is deactivated, each of the first and the second counters 54 and 55 stops the counting operation and holds a current count value. As described above, the count value of the first counter 54 is used as the control bits PUCZQ[1:n] while the count value of the second counter 55 is used as the control bits PDCZQ[1:n]. The control bits which may be collectively called impedance control information are determined in the calibration operation and supplied to the parallel-to-serial conversion circuit 60.

[Calibration Operation]

In the case where the calibration operation is carried out, the external resistance element R must be connected to the ZQ terminal in advance. As the external resistance element R, it is necessary to use a resistor having an impedance equal to a desired impedance of the output buffer 82 (=the impedance of the replica buffer). Accordingly, the external resistance element R of 240 ohm is used in this embodiment.

When the calibration operation is requested by a calibration command, the command decoder 20 activates the control signal ZQACT1 to start the counting operation of the first counter 54 of the ZQ control circuit 50. In an initial state, for example, after power on, the count value of the first counter 54 is reset into all "1" by way of example. Therefore, all of the control bits PUCZQ[1:n] given as the output of the first counter 54 have a high level. Accordingly, all of the PMOS transistors of the first pull-up circuit 51 are put into an off state. As a result, the comparison signal COMP1, namely, the output of the first comparing circuit 56 has a low level.

Consequently, the first counter 54 starts the count-down operation and, in association therewith, the PMOS transistors of the first pull-up circuit 51 are switched on or off. As the count-down operation proceeds, the impedance of the first pull-up circuit 51 gradually lowers and the potential of the ZQ terminal gradually increases. When the impedance of the first pull-up circuit 51 is decreased to a level lower than the desired impedance (240 ohm), the potential of the ZQ terminal exceeds the intermediate voltage (VDD/2) so that the comparison signal COMP1 as the output of the first comparing circuit 56 is inverted into a high level. In response to the high level of the comparison signal COMP1, the first counter 54 starts the count-up operation and increases the impedance of the first pull-up circuit 51.

By repeating the above-mentioned operation, the potential of the ZQ terminal is stabilized around the intermediate voltage (VDD/2). Thereafter, the counting operation of the first counter 54 is stopped with the control signal ZQACT1 being kept activated. Consequently, the count value of the first counter 54 is fixed and the levels of the control bits PUCZQ[1:n] are determined or fixed.

Furthermore, by the above-mentioned operation, each impedance of the first and the second pull-up circuits 51 and 52 is adjusted to 240 ohm.

Next, the counting operation of the second counter 55 is started. In an initial state, the count value of the second counter 55 is reset to all "0" by way of example. Therefore, all of the control bits PDCZQ[1:n] produced as the output of the second counter 55 have a low level. Accordingly, all of the NMOS transistors of the pull-down circuit 53 are turned off. As a result, the comparison signal COMP2, namely, the output of the second comparing circuit 57 has a high level.

In response to the high level of the comparison signal COMP2, the second counter 55 starts the count-up operation and, in association therewith, the NMOS transistors of the pull-down circuit 53 are switched on or off. As the count-up operation proceeds, the impedance of the pull-down circuit 53 gradually lowers and the potential of the connection point A gradually lowers. When the impedance of the pull-down circuit 53 is decreased to a level lower than the desired impedance (240 ohm), the potential of the connection point A becomes lower than the intermediate voltage (VDD/2). Therefore, the comparison signal COMP2 produced as the output of the second comparing circuit 57 is inverted into a low level. In response to the low level of the comparison signal COMP2, the second counter 55 starts the count-down operation and increases the impedance of the pull-down circuit 53.

By repeating the count-up and the count-down operations described above, the potential of the connection point A is stabilized around the intermediate voltage (VDD/2). Thereafter, when the control signal ZQACT1 is deactivated, the second counter 55 stop the counting operation. Consequently, the count value of the second counter 55 is fixed and the levels of the control bits PDCZQ[1:n] are determined and fixed.

The impedance of the pull-down circuit 53 is thus adjusted to 240 ohm.

The calibration operation is executed in the manner mentioned above. The impedance control information determined by the calibration operation is supplied to the parallel-to-serial conversion circuit 60, which will subsequently be described, to be converted into the control signal ZQ CAL Code (serial data) and transferred through the serial bus. The control signal ZQ CAL Code (serial data) is converted by the serial-to-parallel conversion circuit 70 back into the control signal ZQ CAL Code (parallel data) and then supplied to the output buffer control circuit 81 illustrated in FIG. 2. Then, the output buffer 82 can operate exactly at the impedance of 240 ohm.

Figure 5:
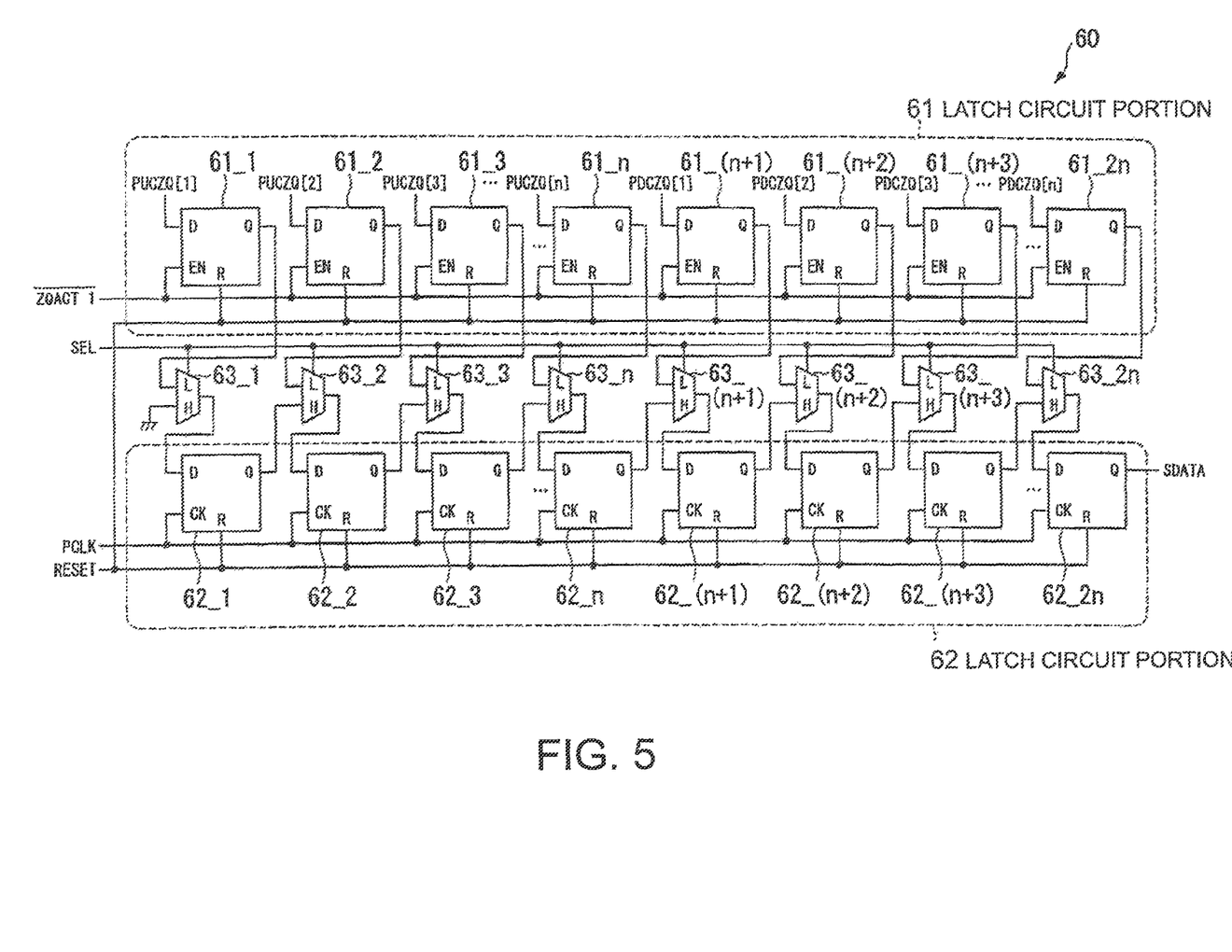
FIG. 5 is a circuit diagram of a parallel-to-serial conversion circuit 60.

FIG. 5 is a circuit diagram of the parallel-to-serial conversion circuit 60.

The parallel-to-serial conversion circuit 60 comprises a latch circuit portion 61, selector circuits 63_1 to 63_2n, and a latch circuit portion 62. The latch circuit portion 61 includes latch circuits DL61-$i$ ($i=1$ to $2n$) and the latch circuit portion 62 includes latch circuits DL62-$i$ ($i=1$ to $2n$).

The parallel-to-serial conversion circuit 60 is supplied with the control bits PUCZQ[1:n] and PDCZQ[1:n] produced by the ZQ control circuit 50 and serially outputs a control signal (namely, serial data signal SDATA). In the parallel-to-serial conversion circuit 60, the latch circuits DL61_1 to DL61_2n of the latch circuit portion 61 capture the control bits PUCZQ[1:n] and PDCZQ[1:n] at the timing when the control signal ZQACT1 is deactivated (at a low level). Thereafter, the latch circuit portion 62 produces the serial data signal SDATA in synchronization with the internal clock signal PCLK. Hereinafter, description will be made in detail. In the example illustrated in FIG. 1, the serial data signal SDATA is supplied to the serial-to-parallel conversion circuit 70 through the single serial bus.

Each of the latch circuits DL61_1 to DL61_2n ($2n$ in number) of the latch circuit portion 61 comprises, for example, a D-type flip-flop and has a data input terminal D, a clock input terminal (enable terminal EN in FIG. 5), a data output terminal Q, and a reset terminal R.

The data input terminal D of each of the latch circuits DL61_$i$ ($i=1$ to n) is connected to the output of the first counter 54 of the ZQ control circuit 50 and is supplied with the control bit PUCZQ[i].

On the other hand, the data input terminal D of each of the latch circuits DL61_$i$ ($i=n+1$ to $2n$) is connected to the output of the second counter 55 of the ZQ control circuit 50 and is supplied with the control bit PDCZQ[i-n].

The data output terminal Q of each of the latch circuits DL61_$i$ ($i=1$ to $2n$) is connected to one input of the selector circuit 63_$i$.

The enable terminal EN of each of the latch circuits DL61_$i$ ($i=1$ to $2n$) is connected to the command decoder 20 and is supplied with a control signal /ZQACT1 obtained by inverting a logic level of the control signal ZQACT1.

The reset terminal R of each of the latch circuits DL61_$i$ ($i=1$ to $2n$) is connected to the command decoder 20 and is supplied with the reset signal RESET.

When the control signal /ZQACT1 supplied to the clock enable terminal EN has a high level (i.e., when the control signal ZQACT1 has a low level as an inactive level), each of the latch circuits DL61_$i$ ($i=1$ to $2n$) latches the data supplied to the data input terminal D, holds the latched data at the data output terminal Q until a next control signal /ZQACT1 has a high level (until a rise), and outputs the latched data as an output signal to one output of the selector circuit 63_$i$.

Supplied with the reset signal RESET of a high level, each of the latch circuits 61_$i$ ($i=1$ to $2n$) resets the level of the output signal from the data output terminal Q into a low level.

The selector circuit 63_1 has one input connected to the data output terminal Q of the latch circuit DL61_1, the other input connected to ground, and an output connected to a data input terminal D of the latch circuit DL62_1.

The selector circuit 63_1 outputs, to the data input terminal D of the latch circuit DL62_1, a signal having the same logic level as that of the data output terminal Q of the latch circuit DL61_1 or a signal of a low level in response to a logic level of a control signal SEL.

Each of the selector circuits 63_$i$ ($i=2$ to $2n$) has one input connected to the data output terminal Q of the latch circuit DL61_$i$, the other input connected to a data output terminal Q of the latch circuit DL62_$(i-1)$, and an output connected to a data output terminal D of the latch circuit DL62_$i$.

The selector circuit $63\_i$ (i=2 to $2n$) outputs, to the data input terminal D of the latch circuit $DL62\_i$, one of the output signal from the data output terminal Q of the latch circuit $DL61\_i$ and an output signal from the data output terminal Q of the latch circuit $DL62\_(i-1)$ in response to the logic level of the control signal SEL.

It is noted here that the control signal SEL is a signal obtained by delaying the control signal /ZQACT1 by a delay time. The delay time must be a time sufficient to allow the latch circuit $DL62\_i$ (i=1 to $2n$) to capture, at the data input terminal D, each control bit outputted from the data output terminal Q of the latch circuit $DL61\_i$ (i=1 to $2n$) when the control signal /ZQACT1 is put into an inactive level (high level). The control signal SEL may be outputted by the command decoder 20. Alternatively, a delay circuit for delaying the control signal /ZQACT1 may be provided in the parallel-to-serial conversion circuit 60. Whichever circuit generates the control signal SEL, a generation logic is incorporated so that, after the control signal /ZQACT1 becomes a high level, the control signal SEL changes into a high level during a period from a first rise to a second rise of the internal clock signal PCLK and is maintained at the high level.

Each of the latch circuits $DL62\_1$ to $DL62\_2n$, $2n$ in number, constituting the latch circuit portion 62 comprises, for example, a D-type flip-flop and has the data input terminal D, a clock input terminal CK, the data output terminal Q, and a reset terminal R.

The data input terminal D of each of the latch circuits $DL62\_i$ (i=1 to n) is connected to the output of the selector circuit $63\_i$ and is supplied with an output signal of the selector circuit $63\_i$.

The data output terminal Q of each of the latch circuits $DL62\_i$ (i=1 to $2n-1$) is connected to the other input of the selector circuit $63\_(i+1)$.

The data output terminal Q of the latch circuit $DL62\_2n$ is connected to the serial-to-parallel conversion circuit 70 through the serial bus illustrated in FIG. 1.

The clock terminal CK of each of the latch circuits $DL62\_i$ (i=1 to $2n$) is connected to the internal clock generation circuit 30 and is supplied with the internal clock signal PCLK.

The reset terminal R of each of the latch circuits $DL62\_i$ (i=1 to $2n$) is connected to the command decoder 20 and is supplied with the reset signal RESET.

With the above-mentioned structure, when the command decoder 20 changes the reset signal RESET from an inactive level (low level) into an active level (high level) before the command decoder 20 changes the control signal /ZQACT1 into a high level, the parallel-to-serial conversion circuit 60 carries out an operation which will presently be described.

Each of the latch circuits $DL61\_i$ (i=1 to $2n$) resets a latched state and produces an output signal of a low level from its data output terminal Q. Each of the latch circuits $DL62\_i$ (i=1 to $2n$) resets a latched state and produces an output signal of a low level from its data output terminal Q.

Thereafter, the command decoder 20 changes the reset signal RESET into an inactive level (low level) and changes the control signal /ZQACT1 from an active level (low level) into an inactive level (high level). Consequently, each of the latch circuits $DL61\_i$ (i=1 to n) captures the control bit PUCZQ[i] through its data input terminal D, holds the value of the control bit as held data, and outputs the held data as the output signal through its data output terminal Q. At this time, the control signal SEL has a low level and the selector circuit $63\_i$ (i=1 to $2n$) outputs the output signal from the data output terminal Q of the latch circuit $DL61\_i$ to the data input terminal D of the latch circuit $DL62\_i$.

At the first rise of the internal clock signal PCLK (transition from a low level to a high level), each of the latch circuits $DL62\_i$ (i=1 to $2n-1$) captures, through its data input terminal D, the output signal of the selector circuit $63\_i$, latches the captured output signal of the selector circuit $63\_i$ until the next rise of the internal clock signal PCLK, and outputs the captured output signal to the other input of the selector circuit $63\_(i+1)$.

At this time, the output signal of the selector circuit $63\_i$ is the output signal from the data output terminal Q of the latch circuit $DL61\_i$. Therefore, the output signal from the data output terminal Q of the latch circuit $DL62\_i$ is the control bit captured by the latch circuit $DL61\_i$.

The latch circuit $DL62\_2n$ captures, through its data input terminal D, the output signal of the selector circuit $63\_2n$ and, until the next rise of the internal clock signal PCLK, outputs the captured output signal of the selector circuit $63\_i$ to the serial bus as a first data of the serial data signal SDATA. The first data of the serial data signal SDATA is the control bit PDCZQ[n].

In each of the selector circuits $63\_i$ (i=2 to $2n$), the control signal SEL is switched from a low level into a high level during a period from the first rise to the next rise of the internal clock signal PCLK. Consequently, the selector circuit $63\_i$ outputs the output signal from the data output terminal Q of the latch circuit $DL62\_(i-1)$, not the output signal from the data output terminal Q of the latch circuit $DL61\_i$. In the selector circuit $63\_1$, the output signal changes into a low level.

At the second rise of the internal clock signal PCLK, each of the latch circuits $DL62\_i$ (i=2 to $2n-1$) captures, through its data input terminal D, the output signal of the selector circuit $63\_i$, latches the captured output signal of the selector circuit $63\_i$ until the next rise of the internal clock signal PCLK, and outputs the captured output signal to the other input of the selector circuit $63\_(i+1)$.

At this time, the output signal of the selector circuit $63\_i$ is the output signal from the data output terminal Q of the latch circuit $DL62\_(i-1)$. Therefore, the output signal from the data output terminal Q of the latch circuit $DL62\_i$ is the control bit captured by the latch circuit $DL61\_(i-1)$.

The latch circuit $DL62\_2n$ captures, through its data input terminal D, the output signal of the selector circuit $63\_2n$ and, until the next rise of the internal clock signal PCLK, outputs the captured output signal of the selector circuit $63\_i$ to the serial bus as second data of the serial data signal SDATA. The second data of the serial data signal SDATA is the control bit PDCZQ[n-1]. The output signal of the selector circuit $63\_1$ changes into a ground level (low level) as the other input of the selector circuit $63\_1$.

Subsequently, at each rise of the internal clock signal PCLK, each latch circuit in the latch circuit portion 62 latches the output signal of the data output terminal Q of a preceding latch circuit and outputs the same to the data input terminal D of a succeeding latch circuit.

At a plurality of times of rises of the internal clock signal PCLK ($2n$ in number), the last latch circuit $DL62\_2n$ in the latch circuit portion 62 outputs the control bits PDCZQ[n] to PDCZQ[1] and the control bits PUCZQ[n] to PUCZQ[1], $2n$ bits in total, as the serial data signal SDATA in the order mentioned above through the serial bus in the central region to the serial-to-parallel conversion circuit 70 in the second region.

Figure 6:
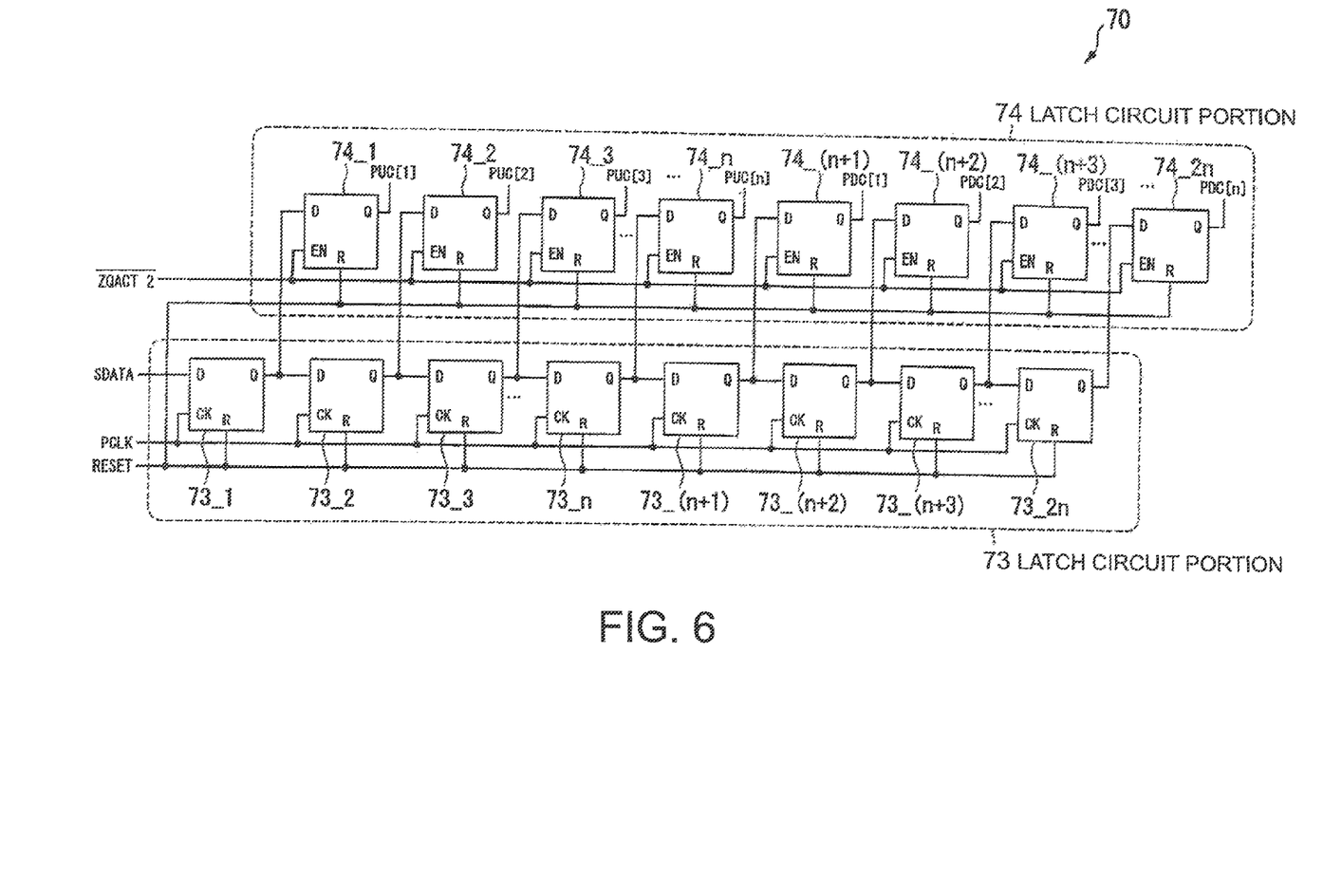
FIG. 6 is a circuit diagram of a serial-to-parallel conversion circuit 70.

FIG. 6 is a circuit diagram of the serial-to-parallel conversion circuit 70.

The serial-to-parallel conversion circuit 70 comprises latch circuit portions 73 and 74.

In the serial-to-parallel conversion circuit 70, the latch circuit portion 73 captures the serial data signal SDATA in synchronization with the internal clock signal PCLK. At a stage wherein the serial data signal SDATA is entirely captured, the control signal ZQACT2 is deactivated (changes into a high level). Consequently, the latch circuit portion 74 captures, in respective latch circuits 74_1 to 74_2n, the control bits (including the control bits PDCZQ[n] to PDCZQ[1] and the control bits PUCZQ[n] to PUCZQ[1], 2n bits in total) and outputs the control signals ZQ CAL Code (PUC[1:n], PDC[1:n]) to the output circuits 80 in parallel. In this embodiment, only one serial-to-parallel conversion circuit 70 is provided (see FIG. 1). However, this invention is not limited thereto and a plurality of serial-to-parallel conversion circuits 70 may be provided in correspondence to a plurality of output buffers. Hereinafter, the serial-to-parallel conversion circuit 70 will be described in detail.

The latch circuit portion 73 comprises latch circuits DL73_1 to DL73_2n, 2n in number. Like the latch circuits DL62_1 to DL62_2n, each of the latch circuits DL73_1 to DL73_2n comprises, for example, a D-type flip-flop and has a data input terminal D, a clock input terminal CK, and a data output terminal Q, and a reset terminal R.

The data input terminal D of the latch circuit DL73_1 is connected through the serial bus to the data output terminal Q of the latch circuit DL62_2n of the parallel-to-serial conversion circuit 60 and is supplied with the serial data signal SDATA, as mentioned before.

The data input terminal D of each of the latch circuits DL73_i (i=2 to 2n) is connected to the data output terminal Q of the preceding latch circuit DL73_(i−1) and is supplied with an output signal from the data output terminal Q of the preceding latch circuit DL73_(i−1).

The data output terminal Q of each of the latch circuits DL73_i (i=1 to 2n) is connected to a data input terminal D of the latch circuit DL74_i of the latch circuit portion 74.

The clock terminal CK of each of the latch circuits DL73_i (i=1 to 2n) is connected to the internal clock generation circuit 30 and is supplied with the internal clock signal PCLK, like the latch circuit portion 62 in the parallel-to-serial conversion circuit 60.

The reset terminal R of each of the latch circuits DL73_i (i=1 to 2n) is connected to the command decoder 20 and is supplied with the reset signal RESET, like the latch circuit portion 62 in the parallel-to-serial conversion circuit 60.

Like the latch circuits DL61_1 to DL61_2n, each of the latch circuits DL74_1 to DL74_2n of the latch circuit portion 74 comprises, for example, a D-type flip-flop and has the data input terminal D, a clock input terminal (enable terminal EN in FIG. 6), a data output terminal Q, and a reset terminal R.

The data input terminal D of each of the latch circuits DL74_i (i=1 to n) is connected to the data output terminal Q of the latch circuit DL73_i in the latch circuit portion 73.

The data output terminal Q of each of the latch circuits DL74_i (i=1 to n) is connected to the OR circuit 85_i (see FIG. 2) of the output buffer control circuit 81 in each of the output circuits 80.

The data output terminal Q of each of the latch circuits DL74_i (i=n+1 to 2n) is connected to the AND circuit 86_i (see FIG. 2) of the output buffer control circuit 81 in each of the output circuits 80.

The enable terminal EN of each of the latch circuits DL74_i (i=1 to 2n) is connected to the command decoder 20 and is supplied with a control signal /ZQACT2 obtained by inverting a logic level of the control signal ZQACT2.

The reset terminal R of each of the latch circuits DL74_i (i=1 to 2n) is connected to the command decoder 20 and is supplied with the reset signal RESET.

When the control signal /ZQACT2 supplied to the clock enable terminal EN is turned into a high level (that is, when the control signal ZQACT2 is turned into a low level as an inactive level), each of the latch circuits DL74_i (i=1 to 2n) latches the data supplied to the data input terminal D, holds the latched data at the data output terminal Q until a next control signal /ZQACT2 becomes a high level (until a rise), and outputs the latched data to the output buffer control circuit 81.

Supplied with the reset signal RESET of a high level, each of the latch circuits DL74_i (i=1 to 2n) resets the level of the data output terminal Q into a low level.

With the above-mentioned structure, at the first rise of the internal clock signal PCLK, each of the latch circuits DL73_i (i=2 to 2n−1) of the latch circuit portion 73 captures through its data input terminal D the output signal from the data output terminal Q of the preceding latch circuit DL73_(i−1). Each of the latch circuits DL73_i latches the captured output signal until the next rise of the internal clock signal PCLK and outputs the captured output signal to the data input terminal D of the succeeding latch circuit DL73_(i+1).

At the first rise of the internal clock signal PCLK, the latch circuit DL73_2n of the latch circuit portion 73 captures through its data input terminal D the output signal (low level) from the data output terminal Q of the preceding latch circuit DL73_(2n−1). The latch circuit DL73_2n latches the captured output signal of a low level until the next rise of the internal clock signal PCLK and outputs the captured output signal to the data input terminal D of the latch circuit DL74_2n.

At the first rise of the internal clock signal PCLK, the latch circuit DL73_1 of the latch circuit portion 73 captures the first data of the serial data signal SDATA through its data input terminal D. The latch circuit DL73_1 latches the captured first data until the next rise of the internal clock signal PCLK, and outputs the captured first data to the data input terminal D of the succeeding latch circuit 73_2.

At the second rise of the internal clock signal PCLK, each of the latch circuits DL73_i (i=2 to 2n−1) captures through its data input terminal D the output signal from the data output terminal Q of the preceding latch circuit DL73_(i−1). Each of the latch circuits DL73_i latches the captured output signal until the next rise of the internal clock signal PCLK and outputs the captured output signal to the data input terminal D of the succeeding latch circuit DL73_(i+1).

At this time, the output signal from the data output terminal Q of the preceding latch circuit DL73_(i−1) is the output signal captured by the latch circuit DL73_(i−1) through the data input terminal D at the first rise of the internal clock signal PCLK and outputted through the data output terminal Q.

At the second rise of the internal clock signal PCLK, the latch circuit DL73_2n of the latch circuit portion 73 captures through its data input terminal D the output signal (L level) outputted by the preceding latch circuit DL73_(2n−1) through the data output terminal Q at the first rise of the internal clock signal PCLK. The latch circuit DL73_2n latches the captured output signal of a low level until the next rise of the internal clock signal PCLK, and outputs the captured output signal to the data input terminal D of the latch circuit DL74_2n.

At the second rise of the internal clock signal PCLK, the latch circuit DL73_1 of the latch circuit portion 73 captures through its data input terminal D the second data of the serial data signal SDATA. The latch circuit DL73_1 latches the captured second data until the next rise of the internal clock signal PCLK, and outputs the captured second data to the data input terminal D of the succeeding latch circuit DL73_2.

Subsequently, at each rise of the internal clock signal PCLK, each latch circuit of the latch circuit portion 73 captures and latches the output signal from the data output terminal Q of the preceding latch circuit and outputs the captured and latched output signal to the data input terminal D of the succeeding latch circuit.

At the 2n-th rise of the internal clock signal PCLK, each of the latch circuits DL73_i (i=1 to n) of the latch circuit portion 73 captures the control bit PUCZQ[i] constituting the serial data and outputs the captured data to the data input terminal D of the latch circuit DL74_i.

At the 2n-th rise of the internal clock signal PCLK, each of the latch circuits DL73_i (i=n+1 to 2n) of the latch circuit portion 73 captures the control bit PDCZQ[i-n] constituting the serial data and outputs the captured data to the data input terminal D of the latch circuit DL74_i.

Subsequently, the command decoder 20 changes the control signal /ZQACT2 into a high level at the same time with the 2n-th rise of the internal clock signal PCLK or, thereafter, until the next rise of the internal clock signal PCLK. Consequently, each of the latch circuits DL74_i (i=1 to n) captures the control bit PUCZQ[i] and outputs the captured control bit from its data output terminal Q to the OR circuit 85_i of the output buffer control circuit 81 as the control signal ZQ CAL Code (PUC[i]). Each of the latch circuits DL74_i (i=n+1 to 2n) captures the control bit PDCZQ[i-n] and outputs the captured control bit from its data output terminal Q to the AND circuit 86_i of the output buffer control circuit 81 as the control signal ZQ CAL Code (PDC[i-n]).

In the foregoing, the structure of each circuit in the semiconductor device 100 illustrated in FIG. 1 has been described. Next referring to FIG. 7, description will be made about an operation of the semiconductor device 100 in this embodiment when the ZQ calibration is carried out.

Figure 7:
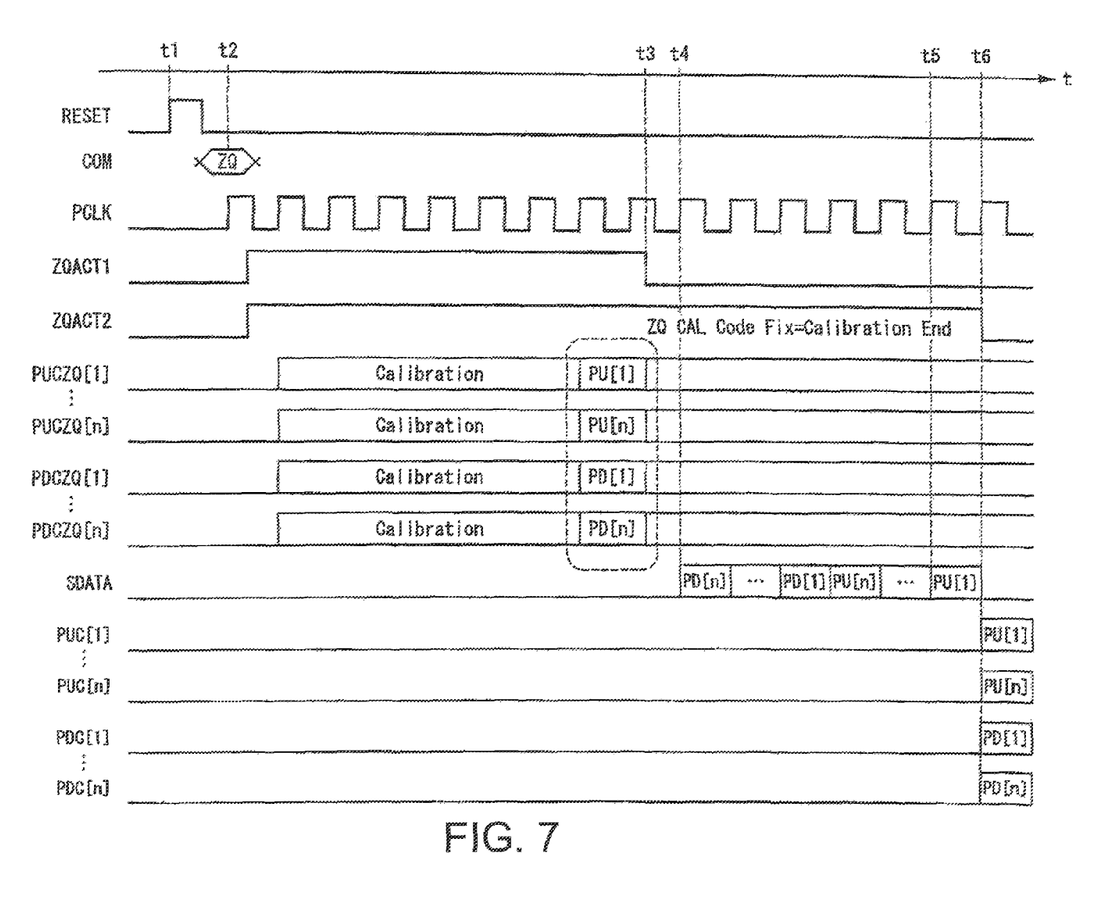
FIG. 7 is a timing waveform diagram of ZQ calibration of the semiconductor device illustrated in FIG. 1.

FIG. 7 is a timing waveform diagram of the ZQ calibration in the semiconductor device 100 according to this embodiment.

At a time instant t1 after power on, the command decoder 20 activates the RESET signal (into a high level). Consequently, in the semiconductor device 100, the internal circuits including the parallel-to-serial conversion circuit 60 and the serial-to-parallel conversion circuit 70 are reset.

At a time instant t2, a ZQ calibration command is supplied from the outside. Then, the command decoder 20 activates the control signals ZQACT1 and ZQACT2 (into a high level).

During an activation period of the control signal ZQACT1, the ZQ control circuit 50 in the ZQ circuit 40 carries out the calibration operation. The ZQ control circuit 50 determines the impedance control information.

At a time instant t3, in response to deactivation of the control signal ZQACT1, the latch circuit portion 61 (FIG. 5) of the parallel-to-serial conversion circuit 60 captures a plurality of control bits (the control signal ZQ CAL Code (parallel) constituted by the control bits PUCZQ[1:n] and PDCZQ[1:n]).

In synchronization with the internal clock signal PCLK, the latch circuit portion 62 (FIG. 5) outputs the serial data signal SDATA obtained by converting the control bits PUCZQ[1:n] and PDCZQ[1:n] into the control signal ZQ CAL Code (serial). The serial data signal SDATA is outputted from a time instant t4 to a time instant t5 in the order of the control bits PDCZQ[n] to PDCZQ[1] and the control bits PUCZQ[n] to PUCZQ[1].

At a time instant t6, at a stage wherein the latch circuit portion 73 of the serial-to-parallel conversion circuit 70 captures the control bit PUCZQ[1] as a final bit, the command decoder 20 (FIG. 1) deactivates the control signal ZQACT2 (into a low level). In response to the deactivation of the command decoder 20, the latch circuit portion 74 (FIG. 6) outputs the control signal ZQ CAL Code (the control signal ZQ CAL Code (parallel) constituted by PUC[1] to PUC[n] and PDC[1] to PDC[n]), in parallel, to the output buffer control circuits 81 (FIG. 2) of the output circuits 80.

In response to the control signal ZQ CAL Code (PUC[1] to PUC[n], PDC[1] to PDC[n]), the output buffer control circuit 81 outputs, to the output buffer 82, PU OUT1 to PU OUTi and PD OUT1 to PD OUTi for turning on or off the PMOS transistors and the NMOS transistors in the output buffer 82.

In the above-mentioned manner, the impedance of the output buffer 82 during the read operation or the ZQ calibration is determined and fixed.

In this embodiment, the control bits PUCZQ[1:n] and PDCZQ[1:n] produced by the ZQ control circuit 50 are converted into the serial data signal SDATA and transmitted to the same serial bus. However, this invention is not limited thereto and, for example, may have a structure in which the control bits PUCZQ[1:n] and the control bits PDCZQ[1:n] are converted into respective serial data to be transmitted through two serial buses.

As described above, the semiconductor device (100) according to this invention comprises a ZQ circuit (ZQ circuit 40) which generates impedance control information (a plurality of control bits PUCZQ[1:n] and PDCZQ[1:n]) and an output buffer (output buffers 82) having an impedance controlled in response to the impedance control information. The control bits constituting the impedance control information are serially transferred from the ZQ circuit.

A semiconductor device (100) according to this invention comprises a semiconductor chip having a first region, a second region, and a third region interposed between the first and the second regions. The semiconductor chip comprises a ZQ terminal arranged in the first region, a ZQ circuit (ZQ circuit 40) which is arranged in the first region and connected to the ZQ terminal and which generates impedance control information constituted by a plurality of control bits (PUCZQ[1:n] and PDCZQ[1:n]), DQ terminals arranged in the second region, an output buffer (output buffers 82) which is arranged in the second region and connected to the DQ terminal and which has an impedance adjusted in response to the impedance control information, and a serial bus which is extracted from the ZQ circuit and reaches the second region across the third region and which serially transfers the control bits from the ZQ circuit.

A method of adjusting an impedance of an output buffer according to this invention includes generating a plurality of control bits in parallel in response to a ZQ command, serially transferring the control bits generated in parallel, converting the serially transferred control bits into parallel data, and adjusting the impedance of the output buffer in response to the control bits converted into the parallel data.

Thus, according to this invention, a plurality of control bits (PUC[1 to n], PDC[1 to n]) for controlling the impedance of the output buffer (output buffers 82) are serially transferred from the ZQ circuit (40) so that the number of signal wires for transferring the control bits can be reduced and the wiring area is diminished. When the control bits are not serially transferred, it is necessary to provide, from the first region towards the second region, signal wires, (n×2) in total number, for transferring the control bits PUCZQ[1:n] and PDCZQ[1:n] produced by the ZQ control circuit 50. However, in this invention, the serial data signal SDATA is transferred through the serial bus so that the number of signal wires can be reduced to three for transferring the internal clock signal PCLK, the reset signal RESET, and the serial data signal SDATA and, therefore, the wiring area can be diminished.

Figure 8:
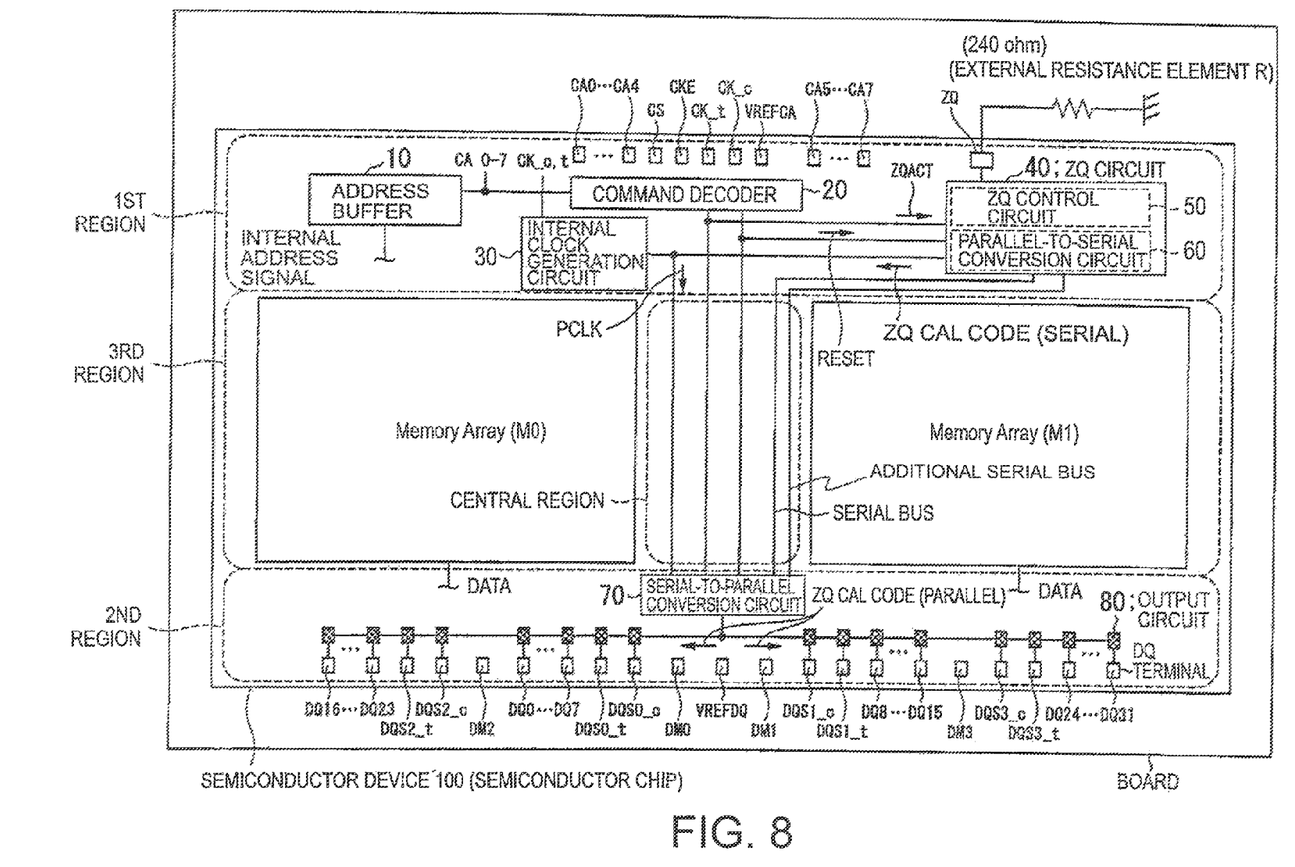
FIG. 8 is a block diagram showing the structure of a semiconductor device according to a second embodiment of this invention.

Referring to FIG. 8, a semiconductor device 100 according to a second embodiment of this invention is similar in structure and operation to that illustrated in FIG. 1 except that PUC[1] to PUC[n] and PDC[1] to PDC[n]) which form ZQ CAL Code are serially transferred through individual buses, namely, the serial bus and an additional bus, as shown in FIG. 8. With this structure also, it is possible to reduce the number of signal wires arranged within the third region of the semiconductor device 100.

What is claimed is:

1. A semiconductor device comprising:
a ZQ circuit which generates impedance control information including a plurality of control bits and a plurality of additional control bits:
an output buffer receiving the impedance control information so that an impedance of the output buffer is adjusted to a predetermined impedance, the output buffer including a plurality of N-conductivity-type transistors and a plurality of P-conductivity-type transistors, an impedance of the N-conductivity-type transistors being adjusted in response to the control bits, and an impedance of the P-conductivity-type transistors being adjusted in response to the additional control bits;
a serial bus connected to the ZQ circuit to transfer the control bits in serial;
a plurality of parallel buses;
a serial-to-parallel conversion circuit serially receiving the control bits from the serial bus and outputting each of the control bits to a corresponding one of the parallel buses, the control bits of the impedance control information are serially transferred from the ZQ circuit;
an additional serial bus transferring the additional control bits in serial from the ZQ circuit; and
a plurality of additional parallel buses; wherein:
the serial-to-parallel conversion circuit further receives the additional control bits from the additional serial bus in serial and further outputting each of the additional control bits to a corresponding one of the additional parallel buses.

2. The semiconductor device according to claim 1, wherein the ZQ circuit includes:
a ZQ control circuit generating the control bits and the additional control bits of the impedance control information in parallel; and
a parallel-to-serial conversion circuit receiving the control bits and the additional control bits from the ZQ control circuit, the parallel-to-serial conversion circuit serially outputting the control bits to the serial bus and further serially outputting the additional control bits to the additional serial bus.

3. The semiconductor device according to claim 2, further comprising a ZQ terminal connected between the ZQ circuit and a resistance element outside the semiconductor device, wherein the ZQ control circuit of the ZQ circuit includes:
a first pull-up circuit connected to the ZQ terminal;
a first comparing circuit comparing a voltage of the ZQ terminal and a reference voltage to output a first comparison signal;
a first counter outputting the control bits to the first pull-up circuit based on the first comparison signal;
a second pull-up circuit receiving the control bits from the first counter;
a pull-down circuit connected to the second pull-up circuit via an internal node;
a second comparing circuit comparing the reference voltage and a voltage of the internal node to output a second comparison signal; and
a second counter outputting the adding control bits to the pull-down circuit based on the second comparison signal.

4. A semiconductor device including a first region, a second region, and a third region sandwiched between the first and second regions, the third region including a memory cell array region including plurality of memory cells, the semiconductor device comprising:
a ZQ circuit arranged in the first region and generating a plurality of control bits;
an output control circuit arranged in the second region and including an output buffer having an impedance adjusted in response to the control bits;
a serial bus coupled between ZQ circuit and the output control circuit to transfer the control bits in serial to the output control circuit from the ZQ circuit with crossing the third region;
a ZQ terminal arranged in the first region and connected between the ZQ circuit and a resistance element outside the semiconductor device; and
a DQ terminal arranged in the second region and connected to the output buffer of the output control circuit, wherein the third region further includes an additional memory cell array region including a plurality of memory cells and a center region sandwiched between the memory cell array region and the additional memory cell array region, the central region being free from memory cells, and the serial bus being arranged in the central region.

5. The semiconductor device according to claim 4, wherein:
the first, second and third regions are arranged in a first direction, the memory cell array region, the additional memory cell array region and the central region of the third region being arranged in a second direction perpendicular to the first direction.

6. The semiconductor device according to claim 5, wherein:
the output control circuit further includes a serial-to-parallel conversion circuit supplied with the control bits serially transferred from the serial bus and outputting the control bits to the output buffer in parallel.

7. The semiconductor device according to claim 6, further comprising:
a command address terminal arranged in the first region and receiving an external command signal; and
a command decoder arranged in the first region, the command decoder being connected to the command address terminal and outputting a ZQACT signal to the ZQ circuit based on the external command signal, wherein the ZQ circuit is activated in response to the ZQACT signal.

8. A semiconductor device including first and second regions and a third region between the first and second regions, the semiconductor device comprising:
a ZQ terminal arranged in the first region and coupled to a resistance element outside the semiconductor device;
a ZQ circuit arranged in the first region, the ZQ circuit being coupled to the ZQ terminal to generate a plurality of control bits;

an output control circuit arranged in the second region, the output control circuit including an output buffer of which impedance is adjusted in response to the control bits;

first and second memory cell arrays arranged separately from each other in the third region; and a serial bus elongating between the first and second memory arrays in the third region and connecting the ZQ circuit and the output control circuit to transfer the control bits in serial to the output control circuit from the ZQ circuit.

9. The semiconductor device according to claim 8, further comprising a DQ terminal arranged in the second region and coupled to the output buffer of the output control circuit.

10. The semiconductor device according to claim 8, wherein the first, second and third regions are arranged in a first direction and the first and second memory cell arrays are arranged in a second direction substantially vertical to the first direction.

11. The semiconductor device according to claim 8, further comprising a plurality of command input terminals in the first region.

12. The semiconductor device according to claim 11, wherein the first, second and third regions are arranged in a first direction and the command terminals are arranged in a second direction substantially vertical to the first direction.

13. The semiconductor device according to claim 8, further comprising:

a plurality of additional output control circuits arranged in the second region, the additional output control circuits including a plurality of additional output buffers, respectively, and each of the additional output buffers being adjusted in impedance in response to the control bits; and a plurality of additional DQ terminals arranged in the second region, the additional DQ terminals being coupled respectively to the output buffers of the output control circuits.

14. The semiconductor device according to claim 13, wherein the first, second and third regions are arranged in a first direction, the additional output control circuits being arranged in a second direction substantially vertical to the first direction and the additional DQ terminals being arranged in the second direction.

* * * * *